(12) United States Patent
Inao et al.

(10) Patent No.: US 9,337,074 B2
(45) Date of Patent: May 10, 2016

(54) ATTACHING DEVICE AND ATTACHING METHOD

(71) Applicant: Tokyo Ohka Kogyo Co., Ltd., Kawasaki-shi (JP)

(72) Inventors: Yoshihiro Inao, Kawasaki (JP); Shigeru Kato, Kawasaki (JP); Shugo Tsushima, Kawasaki (JP); Junichi Katsuragawa, Kawasaki (JP); Satoshi Kobari, Kawasaki (JP); Akihiko Nakamura, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/431,902

(22) PCT Filed: Sep. 5, 2013

(86) PCT No.: PCT/JP2013/073936
§ 371 (c)(1),
(2) Date: Mar. 27, 2015

(87) PCT Pub. No.: WO2014/050484
PCT Pub. Date: Apr. 3, 2014

(65) Prior Publication Data
US 2015/0262858 A1 Sep. 17, 2015

(30) Foreign Application Priority Data

Sep. 28, 2012 (JP) .................................. 2012-218720
Feb. 5, 2013 (JP) .................................. 2013-020895

(51) Int. Cl.
*H01L 21/68* (2006.01)
*H01L 21/683* (2006.01)
(Continued)

(52) U.S. Cl.
CPC ...... *H01L 21/6835* (2013.01); *H01L 21/67092* (2013.01); *B25J 11/0095* (2013.01);
(Continued)

(58) Field of Classification Search
CPC .............. B32B 2457/14; B25J 11/0095; B25J 15/0042; H01L 21/687; H01L 21/68721
See application file for complete search history.

(56) References Cited

U.S. PATENT DOCUMENTS 6,828,772 B1 * 12/2004 Hofer et al. ............... 324/750.19
2007/0125495 A1 * 6/2007 Nakamura et al. ............ 156/382
(Continued)

FOREIGN PATENT DOCUMENTS

JP 2007-158122 6/2007
JP 2008-166548 7/2008
(Continued)

OTHER PUBLICATIONS

International Search Report in PCT/JP2013/073936 dated Dec. 10, 2013.

*Primary Examiner* — Carson Gross
(74) *Attorney, Agent, or Firm* — Knobbe Martens Olson & Bear LLP

(57) ABSTRACT

An attaching device configured to attach a substrate and a support via an adhesive layer is provided with support holding members. Holding tools of the support holding members are configured to hold the support with oblique surface parts (contact members) of the holding tools without coming into contact with a surface of the support, which is to be attached to the substrate. The attaching device attaches, to the substrate, the support of which the surface is held not to be contacted.

12 Claims, 12 Drawing Sheets

(51) Int. Cl.
*H01L 21/67* (2006.01)
*B25J 15/00* (2006.01)
*H01L 21/687* (2006.01)
*B25J 11/00* (2006.01)

(52) U.S. Cl.
CPC ............ *B25J15/0042* (2013.01); *H01L 21/687* (2013.01); *H01L 21/68721* (2013.01); *H01L 2221/68304* (2013.01); *H01L 2221/68327* (2013.01); *H01L 2221/68381* (2013.01); *Y10T 156/10* (2015.01); *Y10T 156/17* (2015.01)

(56) References Cited

U.S. PATENT DOCUMENTS

| | | | |
|---|---|---|---|
| 2010/0038035 A1* | 2/2010 | Noda et al. | 156/379.6 |
| 2012/0132359 A1 | 5/2012 | Nakamura et al. | |
| 2013/0244400 A1* | 9/2013 | George et al. | 438/458 |

FOREIGN PATENT DOCUMENTS

| JP | 2008-182127 | 8/2008 |
|---|---|---|
| JP | 2011-040691 | 2/2011 |

\* cited by examiner

ATTACHING DEVICE AND ATTACHING METHOD

This application is the U.S. National Phase under 35 U.S.C. §371 of International Application No. PCT/JP2013/73936 filed Sep. 5, 2013, designating the U.S., and published in Japanese as WO 2014/050484 on Apr. 3, 2014, which claims priority to Japanese Patent Application No. 2012-218720, filed Sep. 28, 2012; and Japanese Patent Application No. 2013-020895, filed Feb. 5, 2013, the entire contents of which are incorporated herein by reference.

TECHNICAL FIELD

The present invention relates to an attaching device and an attaching method for attaching a substrate and a support configured to support the substrate via an adhesive layer.

BACKGROUND ART

In recent years, as a portable phone, a digital AV device, an IC card and the like have been sophisticated, there is a growing demand for reduction in size and thickness of a semiconductor silicon chip to be mounted (hereinafter, referred to as 'chip'), so as to highly integrate the chips in a package. For example, in an integrated circuit in which a plurality of chips is constituted into a one packaging structure, as typified by a CSP (chip size package) or MCP (multi-chip package), the further thinning is required. In order to implement the high integration of the chips in the package, it is required to thin a thickness of the chip to a range of 25 to 150 µm.

However, since a semiconductor wafer (hereinafter, referred to as 'wafer'), which is a base of the chip, is thinned by the grinding, the strength thereof is weakened, so that a crack or bending is likely to occur. Also, since it is difficult to automatically convey the wafer of which strength is weakened due to the reduction in the thickness, the wafer should be conveyed by a person's hand, which makes the handling troublesome.

For this reason, a wafer handling system has been developed which is configured to attach a plate made of glass, silicon or rigid plastic and referred to as a support plate to a wafer to be ground, thereby holding strength of the wafer and preventing occurrence of a crack and bending of the wafer. Since it is possible to keep the strength of the wafer by the wafer handling system, it is possible to implement the automatic conveyance of the thinned wafer.

In the wafer handling system, the wafer and the support plate are attached to each other using an adhesive layer formed by an adhesive tape, a thermoplastic resin, an adhesive and the like.

Regarding an attaching device and an attaching method for performing the attaching, Patent Document 1 discloses an attaching device and an attaching method, in which a placement plate on which a substrate is placed, a press plate configured to press a support plate to the substrate and a pair of alignment members capable of advancing and retreating in a horizontal direction are provided, and a tip portion of the alignment member is provided with a blade configured to support a lower surface of a peripheral edge portion of the support plate and a pressing member configured to perform a positioning operation with the support plate being overlapped over the substrate. Also, Patent Document 2 discloses a superimposing unit and an attaching device in which a support unit configured to support a wafer or support plate and a conveying unit configured to convey the wafer or support plate are provided, and the support unit has three or more columnar members having a first support part configured to support an end portion of the wafer or support plate and a first positioning part configured to guide the end portion to the first support part.

PRIOR TECHNICAL DOCUMENTS

Patent Documents

[Patent Document 1] Japanese Patent Application Publication No. 2007-158122A (Jun. 21, 2007)
[Patent Document 2] Japanese Patent Application Publication No. 2008-182127A (Aug. 7, 2008)

SUMMARY OF THE INVENTION

Problems To Be Solved

The wafer is provided for a variety of processes such as a circuit forming process with being attached to the support plate. For this reason, the positioning precision of the wafer and the support plate upon the attaching is very important because it highly influences a quality of a product.

However, according to the attaching devices disclosed in Patent Documents 1 and 2, a holding member (the blade, the support unit) configured to hold the support plate is pulled out (retreated) from a superimposing part of the wafer and the support plate just before the wafer (substrate) and the support plate are superimposed. For this reason, according to the attaching devices disclosed in Patent Documents 1 and 2, there is a disadvantage that the wafer and the support plate are likely to positionally deviate. Also, according to the attaching devices disclosed in Patent Documents 1 and 2, the holding member is configured to hold an attaching surface (surface) of the support plate to the wafer. That is, the holding member is contacted to the attaching surface of the support plate. For this reason, there is a disadvantage that the support plate may be damaged or contaminated due to particles.

Accordingly, there is a need for an attaching device and an attaching method capable of improving positioning precision of a substrate and a support upon attaching and a quality.

It is therefore an object of the present invention to provide an attaching device and an attaching method capable of improving positioning precision of a substrate and a support upon attaching and a quality.

Means for Solving the Problems

According to the present invention, there is provided an attaching device configured to attach a substrate and a support configured to support the substrate, via an adhesive layer. The attaching device includes a support holding member configured to hold the support, wherein the support holding member is configured to hold the support without coming into contact with at least a surface of the support, which is to be attached to the substrate via the adhesive layer.

Also, according to the present invention, there is provided an attaching method of attaching a substrate and a support configured to support the substrate, via an adhesive layer. The attaching method includes a support holding process of holding the support without coming into contact with at least a surface of the support, which is to be attached to the substrate via the adhesive layer, and an attaching process of attaching, to the substrate, the support of which the surface is held not to be contacted.

Effects of the Invention

According to the attaching device of the present invention, the support holding member is configured to hold the support without coming into contact with at least a surface of the support, which is to be attached to the substrate via the adhesive layer. Therefore, it is not necessary to retreat the support holding member from an attaching part of the substrate and the support just before attaching the substrate and the support. Also, it is possible to attach the substrate and the support with the support being held by the support holding member. Further, it is possible to avoid the concerns that the support will be damaged or contaminated due to particles and the like. For this reason, it is possible to provide the attaching device having improved the positioning precision of the substrate and the support upon the attaching and the quality.

Also, in recent years, a separation method of separating the attached substrate and support by light irradiation has been adopted. When the separation method is adopted, a release layer that is altered by absorption of the irradiated light is formed on a surface of the support facing the substrate, for example. Also in the case of adopting the separation method, according to the attaching device of the present invention, since the support holding member configured to hold the support does not contact a surface of the release layer, it is possible to avoid the concern that the release layer will be damaged, and to thus keep the quality of the release layer.

According to the attaching method of the present invention, in the support holding process, the support is held so that at least the surface thereof, which is to be attached to the substrate via the adhesive layer, is not contacted, and in the attaching process, the support of which the surface is held not to be contacted is attached to the substrate. For this reason, it is possible to provide the attaching method having improved the positioning precision of the substrate and the support upon the attaching and the quality.

DETAILED DESCRIPTION OF ILLUSTRATIVE EMBODIMENTS

Figure 1:
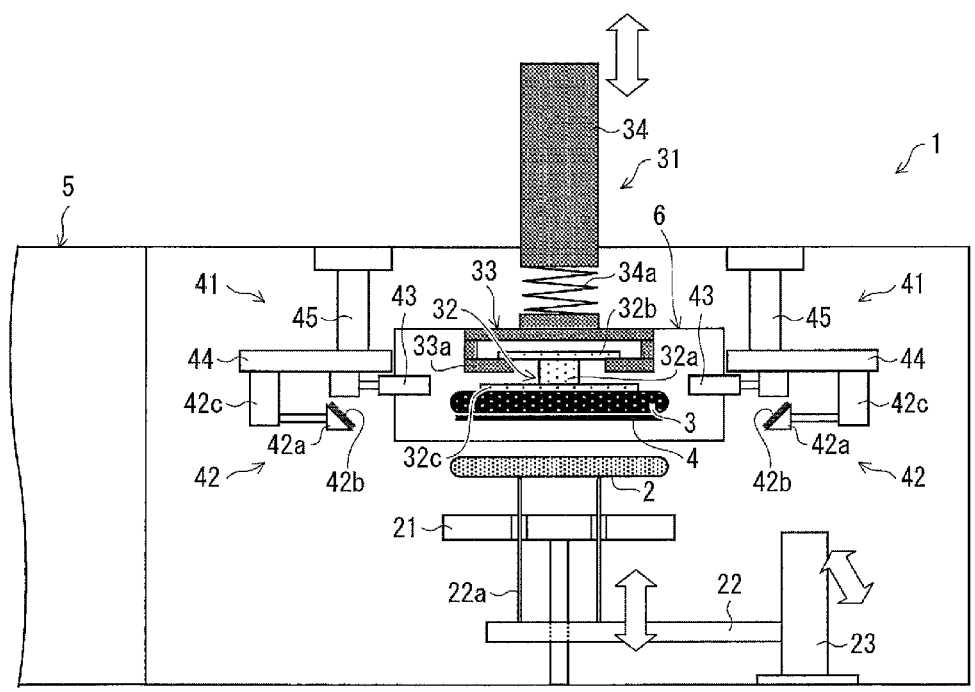
FIG. 1 is a front view illustrating a schematic configuration of an attaching device according to a first illustrative embodiment of the present invention.

The attaching device of the present invention is an attaching device configured to attach a substrate and a support configured to support the substrate, via an adhesive layer, and including a support holding member configured to hold the support, and the support holding member is configured to hold the support without coming into contact with at least a surface of the support, which is to be attached to the substrate via the adhesive layer.

Also, the attaching method of the present invention is an attaching method of attaching a substrate and a support configured to support the substrate, via an adhesive layer, which includes a support holding process of holding the support without coming into contact with at least a surface of the support, which is to be attached to the substrate via the adhesive layer, and an attaching process of attaching, to the substrate, the support of which the surface is held not to be contacted.

First, a substrate, a support and an adhesive layer, which are to be attached by the attaching device of the present invention, are described.

In the present invention, a substrate that is an attaching target is not particularly limited. However, a substrate that is to be handled in a wafer handling system is appropriate. That is, a substrate that is provided for thinning, conveying and mounting processes with being supported (adhered) to a support plate is appropriate. The substrate is not limited to a wafer substrate (silicon wafer), and may be any substrate that is required to be supported by the support plate, for example, a ceramics substrate, a thin film substrate, a flexible substrate and the like. In the meantime, a diameter of the substrate may be 200 mm or 300 mm but is not particularly limited.

In the wafer handling system, the substrate is handled as a laminate in which a substrate, an adhesive layer including a thermoplastic resin, for example, and a support plate (support) configured to support the substrate are stacked in corresponding order. An adhesive is applied to any one of the substrate and the support plate, so that the substrate, the adhesive layer and the support plate are stacked in corresponding order. As a result, the laminate is formed.

The support plate is a support configured to support the substrate and is bonded to the substrate via the adhesive layer. For this reason, the support plate may have strength needed to prevent a damage or deformation of the substrate during the thinning, conveying and mounting processes of the substrate and is preferably more lightweight. From these standpoints, the support plate is more preferably made of glass, silicon, acryl-based resin, polyimide and the like. A diameter of the support plate is preferably slightly greater than the diameter of the substrate.

The adhesive configuring the adhesive layer preferably contains, as an adhesive material, a thermoplastic resin of which thermal flowability is improved by heating, for example. As the thermoplastic resin, an acryl-based resin, a styrene-based resin, a maleimide-based resin, a hydrocarbon-based resin, an elastomer and the like may be exemplified. A method of forming the adhesive layer, i.e., a method of applying the adhesive to the substrate or support plate or a method of applying the adhesive to a base material to form an adhesive tape is not particularly limited. Also, a thickness of the adhesive layer can be appropriately set depending on types of the substrate and the support plate, which are the bonding targets, a step of a substrate surface, processing to be performed for the substrate after the bonding, and the like.

Also, other layer may be further formed between the substrate and the support plate, in addition to the adhesive layer, inasmuch as it does not disturb the bonding. For example, a release layer that is altered by light irradiation may be formed between the support plate and the adhesive layer. When the release layer is formed, it is possible to easily separate the substrate and the support plate by irradiation with the light after the thinning, conveying and mounting processes of the substrate.

In the meantime, the adhesive layer forming method and the adhesive layer forming device are not particularly limited, and a variety of methods and devices can be adopted. For example, regarding the adhesive layer forming method, an adhesive tape formed by the application of an adhesive may be bonded to any one of the substrate and the support plate to form the adhesive layer.

First Illustrative Embodiment

An illustrative embodiment of the present invention is described with reference to FIGS. 1 to 3. The present invention is not limited thereto and a variety of changes can be made within the technical scope of the present invention. In below descriptions, a configuration where an adhesive layer and a release layer, as required, are provided on a support surface is exemplified.

<Attaching Device>

As shown in FIG. 1, an attaching device 1 of this illustrative embodiment is a device configured to attach a substrate 2 and a support 3 such as a support plate via an adhesive layer 4 and a release layer (not shown), as required, thereby forming a laminate, and an inside thereof is configured as a superimposition part. The attaching device 1 is provided in the vicinity of a bonding device 5 configured to perform a bonding process of heating and pressurizing the laminate to bond the substrate 2 and the support 3. The attaching device 1 mainly has a stage 21 configured to horizontally place thereon the substrate 2, a support holding mechanism 31 configured to hold the support 3 and positioning mechanisms 41 configured to position (align) the substrate 2 and the support 3. Also, the attaching device 1 is provided with a shutter 6 for taking the substrate 2, the support 3 and a laminate 7 (FIG. 2) in and out, which are conveyed by a conveying arm 8 (FIG. 2) of a conveying device, and a gate (not shown) and an internal conveying arm (not shown) for taking the laminate 7 in and out between the attaching device and the bonding device 5. Further, the attaching device 1 has an exhaust pipe 9 (FIG. 2) connected to a vacuum pump (not shown) so as to vacuate the inside of the attaching device. Also, the attaching device 1 has a supply pipe (not shown) configured to supply nitrogen gas, for example, so as to purge the inside of the attaching device. In the meantime, the substrate 2 is arranged to be conveyed to the attaching device 1 by the conveying arm 8 (refer to FIG. 2) with a surface to be attached to the support 3 being faced upwards. Also, the support 3 is arranged to be conveyed to the attaching device 1 by the conveying arm 8 with a surface to be attached to the substrate 2 facing downwards.

The stage 21 is provided with a lifting device 22 configured to vertically move the substrate 2 placed on the stage 21 and a moving device 23 configured to horizontally move the substrate 2 for positioning. The lifting device 22 has a plurality of pins 22a extending upwards, and the pins 22a protrude upwards from the stage 21 through holes formed at the stage 21. Also, the pin 22a is provided with a spring 22b (FIG. 2) and is configured to absorb shock, which is generated upon vertical movement of the lifting device 22 or upon an attaching process, by the spring 22b. Therefore, the lifting device 22 is configured to place the substrate 2 on the pins 22a and to vertically move the substrate 2 without applying the shock thereto. That is, the lifting device 22 is configured to vertically move the substrate 2 to a predetermined position, in accordance with each process of the attaching process. Also, the lifting device 22 is provided integrally with the moving device 23, so that the substrate 2 can be horizontally moved. The attaching device 1 has a motor (not shown) configured to drive the lifting device 22 and the moving device 23. That is, the lifting device 22 and the moving device 23 are driven and operated by the motor. The driving of the motor is controlled by a control unit (not shown), so that the operations of the lifting device 22 and moving device 23 are controlled.

Also, a lower surface of the stage 21 is provided with a heater configured to heat the stage 21, thereby heating (pre-heating) the substrate 2 and support 3. A calorific value of the heater per a unit time is preferably a calorific value with which the substrate 2 (and the support 3) placed on the stage 21 can be heated to about 250° C. Also, a material of the stage 21 has preferably heat resistance capable of withstanding the high temperatures of about 250° C. For example, metal, ceramics and the like are preferable. However, the present invention is not particularly limited thereto. Further, the stage 21 may be configured so that cooling water can pass therethrough, so as to easily regulate the temperature. An operation of the heater is controlled by the control unit (not shown). In the meantime, when an adhesive, which can be bonded even at the room temperatures, is used, the heater may not be provided.

The support holding mechanism 31 has a holding unit 32 configured to horizontally hold the support 3, an accommodation unit 33 configured to moveably accommodate therein the holding unit 32, and a lifting device 34 configured to vertically move the accommodation unit 33.

An inside of the accommodation unit 33 is hollow so that the holding unit 32 can be moved therein. Also, the accommodation unit 33 is provided at its lower surface part with a collared receiving part 33a having a circular opening so that a holding member 32c of the holding unit 32 protrudes downwardly therethrough with the holding unit 32 being accommodated in the accommodation unit. Further, the accommodation unit 33 is coupled at its upper surface part to an expansion and contraction member 34a provided for the lifting device 34.

The holding unit 32 is provided at an upper part of a cylindrically-shaped cylinder 32a with a circular collared part 32b greater than the opening of the collared receiving part 33a so that the holding unit 32 can be moveably accommodated in the accommodation unit 33. A size of the collared part 32b may be any size disabling the holding unit 32 from separating from the accommodation unit 33 even though the holding unit 32 is moved in the accommodation unit 33. Also, the holding unit 32 is provided at a lower part of the cylinder 32a with a circular holding member 32c configured to hold (chuck) the support 3 by vacuum adsorption or electrostatic adsorption. The holding member 32c is configured to hold a surface of the support 3, which is different from the surface of the support to be attached to the substrate 2. A size of the holding member 32c may be any size capable of stably holding the support 3. Also, the holding member 32c is provided with a supply pipe (not shown) configured to supply nitrogen gas, for example, between the holding member 32c and the support 3 so that the support 3 can be easily separated when releasing the holding of the support 3. An operation of the holding unit 32 is controlled by the control unit (not shown).

At least surfaces of the holding unit 32 and the accommodation unit 33, which are contacted to each other, are preferably smooth so that the holding unit 32 can be easily moved. Therefore, as the materials of the holding unit 32 and the accommodation unit 33, the metals such as stainless steel, a combination of a synthetic resin and metal such as stainless steel, and the like may be exemplified. Among them, when the holding unit 32 is formed of the synthetic resin, the holding unit 32 can be made to be lightweight, so that the holding unit 32 can be more easily moved and the load to be applied to the lifting device 34 can be reduced. In the meantime, the shapes of the holding unit 32 and the accommodation unit 33 may be any shapes enabling the horizontal movement for positioning of the support 3 held by the holding unit 32, and are not limited to the shapes shown in FIG. 1.

The lifting device 34 is vertically provided, and the entirety thereof is configured to be vertically moved (or vertically expanded and contracted) by the driving of the motor (not shown). Thereby, the lifting device 34 is configured to vertically move the holding unit 32. That is, the lifting device 34 is configured to vertically move the support 3 held at the holding unit 32 to a predetermined position in accordance with each process of the attaching process. Also, the lifting device 34 is provided with the expansion and contraction member 34a such as a spring so as to absorb the shock occurring during the attaching process. The driving of the motor is controlled by the control unit (not shown), so that the operation of the lifting device 34 is controlled.

The positioning mechanisms 41 are provided to face each other with the support holding mechanism 31 being positioned therebetween. That is, the attaching device 1 has a pair of the positioning mechanisms 41. The positioning mechanism 41 has a support holding member 42 configured to receive the support 3 being conveyed by the conveying arm 8 (FIG. 2) of the conveying device and to hold the support 3 until the support 3 is held by the support holding mechanism 31. That is, the support holding member 42 is configured to temporarily hold the support 3 during carrying-in of the support 3 (during a support carrying-in process).

The support holding member 42 has a holding tool 42a having an oblique surface part. A contact member 42b made of rubber or fluorine resin is bonded to the oblique surface part of the holding tool 42a so as to prevent a damage of the support 3. The holding tool 42a is configured to hold the support 3 with the oblique surface part (contact member 42b) without coming into contact with at least the surface of the support 3, which is to be attached to the substrate 2 via the adhesive layer 4. More preferably, the holding tool 42a is configured to hold an end portion of the support 3 with the oblique surface part (contact member 42b) during the carrying-in of the support 3. Here, the 'end portion of the support 3' indicates a 'border portion (edge) of a surface and a side of the support 3.'

The holding tool 42a is coupled to a lifting unit 42c such as a spring configured to vertically move the holding tool 42a. That is, the support holding member 42 further has the lifting unit 42c. Also, the positioning mechanism 41 further has a slide unit 44 configured to horizontally move the support holding member 42 and a positioning member 43. Thereby, the holding tool 42a is configured to vertically move and to horizontally move in conformity to a size and a position of the support 3. Here, the horizontal movement of the holding tool 42a indicates movement of the holding tool in directions coming close to the support 3 and getting away from the support 3.

Also, the positioning mechanism 41 has the positioning member 43 configured to position (align) the substrate 2 and the support 3. The positioning member 43 is configured to horizontally move by the slide unit 44. Here, the horizontal movement of the positioning member 43 indicates movement of the positioning member in directions coming close to the substrate 2 or support 3 and getting away from the substrate 2 or support 3. Thereby, the positioning members 43 can position the substrate 2 and the support 3 with sandwiching the same therebetween. The positioning member 43 is made of rubber or fluorine resin so as to prevent the damage of the substrate 2 or support 3.

The positioning member 43 is further configured to position the holding unit 32 of the support holding mechanism 31. That is, the positioning members 43 can position the holding unit 32 with sandwiching the holding member 32c therebetween.

Further, the positioning mechanism 41 has a motor 45 configured to drive the lifting unit 42c and slide unit 44 configured to move the support holding member 42 and positioning member 43. That is, the support holding member 42 and the positioning member 43 are driven and operated by the motor 45 via the lifting unit 42c and the slide unit 44. The driving of the motor 45 is controlled by the control unit (not shown), so that the operations of the support holding member 42 and positioning member 43 are controlled.

The numbers of the support holding members 42 and the positioning members 43 are not limited to the pairs, respectively. For example, each of the support holding members 42 and the positioning members 43 may be provided in plural pairs, for example, in two pairs, depending on the sizes of the substrate 2 and support 3. That is, the positioning mechanism 41 may have the plurality of pairs, for example, two pairs of the support holding members 42 and the positioning members 43, respectively. Also, when the plurality of pairs of the positioning members 43 is provided, the positioning of the substrate 2 and the positioning of the support 3 may be performed by the same pair of positioning members 43 or by the different pairs of the positioning members 43. Further, the specific configurations of the support holding member 42 and the positioning member 43 may be any configurations inasmuch as the support holding member 42 and the positioning member 43 can perform the above-described operations. Therefore, the specific configurations of the support holding member and the positioning member are not limited to the above-described configurations. In the meantime, the positioning mechanism 41 may be mounted to any place of the attaching device 1 where it is possible to receive the support 3 and to position the substrate 2 and the support 3. Therefore, the mounting place thereof is not limited to the place (a ceiling part of the attaching device 1) shown in FIG. 1.

The control unit (not shown) is configured to control the respective configurations of the attaching device 1, in accordance with each process of the attaching process, including the opening/closing of the shutter 6 and the operation of the vacuum pump.

According to the attaching device 1 of this illustrative embodiment, the holding tools 42a of the support holding members 42 are configured to hold the support 3 without coming into contact with at least the surface of the support 3, which is to be attached to the substrate 2 via the adhesive layer 4. Therefore, it is not necessary to retreat the holding tools 42a of the support holding members 42 from an attaching part of the substrate 2 and the support 3 just before attaching the substrate 2 and the support 3. Also, it is possible to attach the substrate 2 and the support 3 with the support 3 being held by the holding tools 42a. Further, it is possible to avoid concerns that the support 3 will be damaged or contaminated by particles and the like. For this reason, it is possible to provide the attaching device having improved positioning precision of the substrate and the support upon the attaching and a quality.

Also, in recent years, a separation method of separating the attached substrate 2 and support 3 by light irradiation has been adopted. When the separation method is adopted, a release layer that is altered by absorption of the irradiated light is formed on a surface of the support 3 facing the substrate 2, for example. Also in the case of adopting the separation method, according to the attaching device 1 of this illustrative embodiment, since the support holding tools 42a of the support holding members 42 configured to hold the support 3 do not contact a surface of the release layer, it is possible to avoid the concern that the release layer will be damaged, and to thus keep the quality of the release layer.

<Attaching Method>

An attaching method of the substrate 2 and the support 3 using the attaching device 1 having the above-described configuration, i.e., the attaching process is sequentially described with reference to FIGS. 2 and 3. Meanwhile, in below descriptions, a configuration where two pairs of the positioning members 43 are provided is exemplified.

Figure 2A:
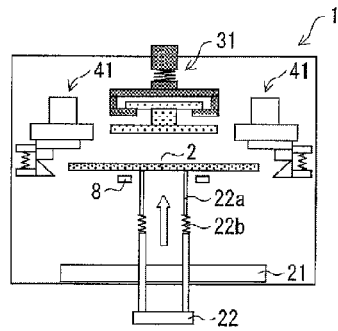
FIGS. 2A to 2F are schematic front views sequentially illustrating an attaching process by the attaching device according to the first illustrative embodiment of the present invention.

First, as shown in FIG. 2A, after the shutter 6 is opened, the substrate 2 is conveyed into the attaching device 1 by the conveying arm 8 of the conveying device, and the substrate 2 is placed on the plurality of pins 22a of the elevated lifting device 22 (a substrate carrying-in process). At this time, the support holding mechanism 31 is located at an upper standby position and the positioning mechanisms 41 are located at standby positions spaced from the substrate 2. Also, while the heater provided on the lower surface of the stage 21 is operating, the vacuum pump is not operating. In the meantime, the conveying arm 8 is configured to hold the surface of the substrate 2, which is different from an attaching surface of the substrate 2 to the support 3.

Figure 2B:
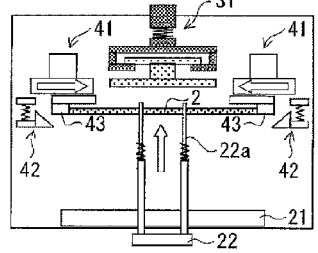

Then, as shown in FIG. 2B, after the conveying arm 8 is retreated and the shutter 6 is closed, the lifting device 22 is further elevated to lift up the substrate 2 to heights of the lower positioning members 43 of the positioning mechanisms 41. Then, the positioning members 43 are moved in the direction coming close to the substrate 2 and are enabled to abut on the substrate 2 to position the substrate 2 (a substrate positioning process).

Figure 2C:
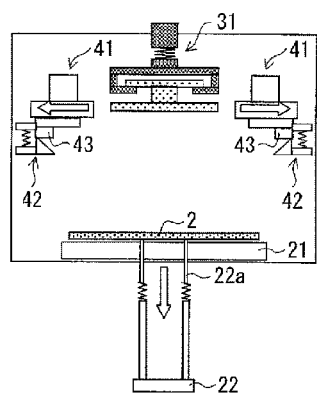

Then, as shown in FIG. 2C, when the positioning of the substrate 2 is over, the positioning members 43 are moved in the direction getting away from the substrate 2, the lifting device 22 is lowered to place the substrate 2 on the stage 21 and the substrate 2 is heated (preheated) (a substrate heating process). In this way, the substrate 2 is conveyed and positioned before the support 3 is conveyed and positioned, i.e., the substrate positioning process is performed before a support carrying-in process, which will be described later, so that it is possible to heat the substrate 2 during the conveying and positioning of the support 3 (simultaneously). Therefore, it is possible to shorten the time consumed to complete the entire attaching process.

Figure 2D:
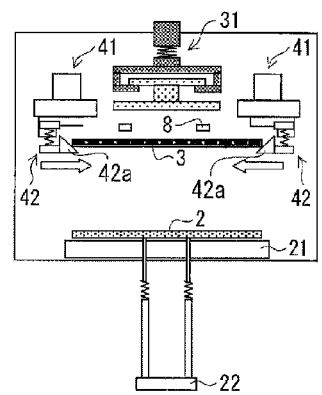

Subsequently, as shown in FIG. 2D, after the shutter 6 is opened, the support 3 is conveyed into the attaching device 1 by the conveying arm 8 of the conveying device and the support 3 is held by the holding tools 42a of the support holding members 42 of the positioning mechanism 41 moved in the direction coming close to the support 3 (a support carrying-in process). That is, the holding tools 42a hold the support 3 without coming into contact with at least the surface of the support 3, which is to be attached to the substrate 2 via the adhesive layer (a support holding process). Specifically, the holding tools 42a hold the end portions of the support 3. In the meantime, the conveying arm 8 is configured to hold the surface (upper surface) of the support 3, which is different from the attaching surface of the support to the substrate 2, by the vacuum adsorption or electrostatic adsorption, for example.

Figure 2E:
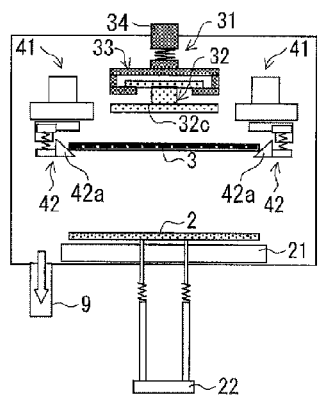

Then, as shown in FIG. 2E, after the conveying arm 8 is retreated, the shutter 6 is closed and the inside of the attaching device is purged by the nitrogen gas, the vacuum pump is activated to vacuate the inside of the attaching device 1. In the meantime, a pressure in the attaching device 1 at that time is preferably set to be about 10 Pa.

Figure 2F:
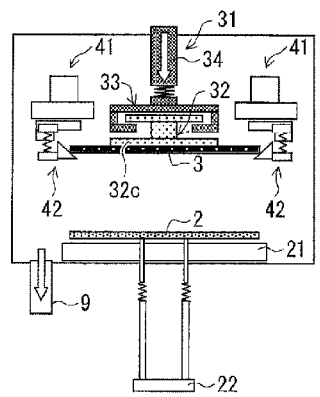

When the inside of the attaching device 1 reaches a vacuum state (a state where the alignment can be performed), the lifting device 34 of the support holding mechanism 31 is lowered to enable the holding member 32c of the holding unit 32 of the support holding mechanism 31 to abut on the surface (upper surface) of the support 3, which is different from the attaching surface of the support to the substrate 2, and the support 3 is vacuum-adsorbed or electrostatically adsorbed and is thus held (chucked) by the holding member 32c, as shown in FIG. 2F. That is, the holding member 32c of the holding unit 32 holds the support 3 without coming into contact with at least the surface of the support 3, which is to be attached to the substrate 2 via the adhesive layer 4. Specifically, the holding member 32c holds the surface (upper surface) of the support 3, which is different from the attaching surface of the support 3 to the substrate 2. When the holding of the support 3 by the holding member 32c is completed, the holding tools 42a of the support holding members 42 holding the support 3 are lowered to release the holding state of the support 3.

Figure 3G:
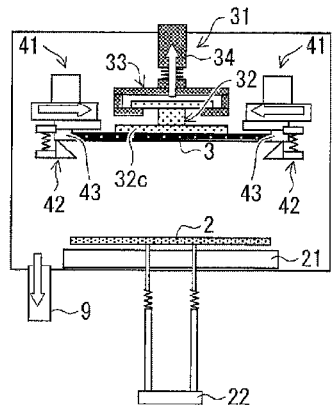
FIGS. 3G to 3L are schematic front views sequentially illustrating the attaching process by the attaching device according to the first illustrative embodiment of the present invention.

Subsequently, as shown in FIG. 3G, the lifting device 34 of the support holding mechanism 31 is elevated to lift up the support 3 to the heights of the lower positioning members 43 of the positioning mechanisms 41. Then, the positioning members 43 are moved in the direction coming close to the support 3 and are enabled to abut on the support 3 to position the support 3. That is, the positioning members 43 are configured to perform the positioning of the support 3 of which the surface is held not to be contacted (a support positioning process). At this time, the holding unit 32 of the support holding mechanism 31 is moved in the accommodation unit 33. Therefore, the support 3 can be positioned with being held at the holding unit 32. In the meantime, the holding tool 42a of the support holding member 42 is located at the lowered position and serves as a dropping prevention function when the support 3 is separated from the holding member 32c of the holding unit 32. Also, since the positioning of the substrate 2 and support 3 is performed by the same positioning members 43, it is possible to further improve the alignment precision of the substrate and the support.

Figure 3H:
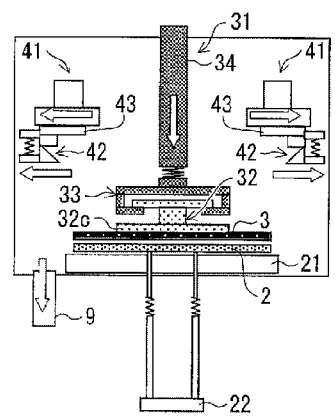

Subsequently, when the positioning of the support 3 is over, the support holding members 42 and the positioning members 43 are moved in the direction getting away from the support 3 and are returned to the standby positions, as shown in FIG. 3H. Then, the lifting device 34 of the support holding mechanism 31 is lowered to bring the support 3 close to the substrate 2. Thereby, the support 3 is heated (preheated) together with the substrate 2 (a support heating process). In the meantime, a distance between the support 3 and the substrate 2 may be any distance within which the support and the substrate are not contacted to each other, for example, about 1 mm to 2 mm, preferably about 1 mm. Also, a heating time period is preferably about 10 seconds to 60 seconds.

Figure 3I:
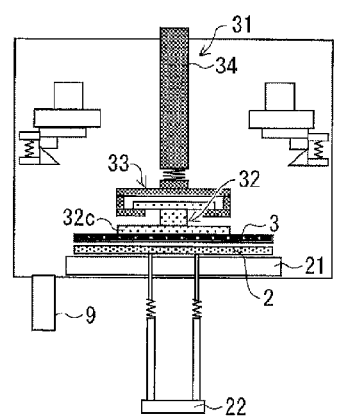

Then, as shown in FIG. 3I, the inside of the attaching device 1 is made to be a vacuum state appropriate to perform an attaching process (a higher vacuum state than the state where the alignment can be performed). In the meantime, the pressure in the attaching device 1 at that time is preferably about 10 Pa.

Figure 3J:
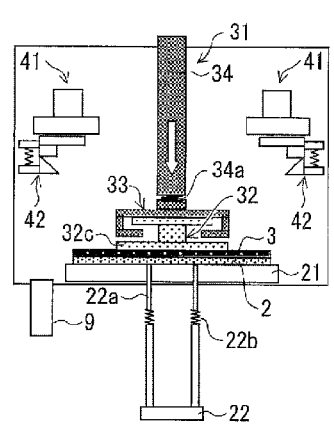

Then, when the predetermined heating time period elapses, the lifting device 34 of the support holding mechanism 31 is further lowered to bring the support 3 into contact with the substrate 2, as shown in FIG. 3J. Thereby, the support 3 is attached to the substrate 2 via the adhesive layer (an attaching process). At this time, the expansion and contraction member 34a of the lifting device 34 and the springs 22b of the pins 22a of the lifting device 22 are contracted, so that a pressing force applied to the substrate 2 is maintained at a predetermined value and the shock is thus absorbed. Therefore, it is possible to attach the substrate 2 and the support 3 without damaging the substrate and the support. In the meantime, the operation of the vacuum pump is once stopped. Also, an attaching time period (a pressing time period of the lifting device 34) is preferably about 10 seconds to 600 seconds.

Figure 3K:
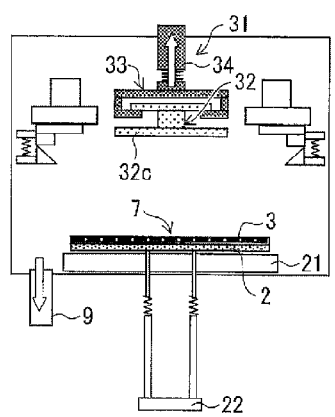

When the predetermined attaching time period elapses, the vacuum pump is again activated, the holding (chucking) of the support 3 by the holding member 32c is released, and the lifting device 34 of the support holding mechanism 31 is elevated to the standby position, as shown in FIG. 3K. Thereby, a laminate 7 in which the substrate 2, the adhesive layer 4 and the support 3 are stacked in corresponding order is placed on the stage 21.

Figure 3L:
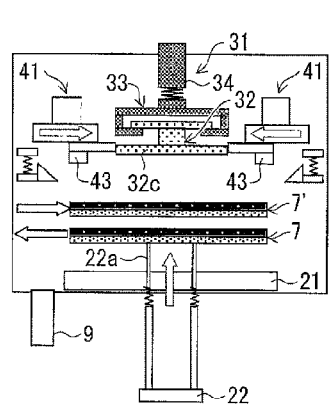

After that, when the vacuum state in the attaching device 1 is the same as the vacuum state in the bonding device 5, the gate (not shown) provided between the attaching device 1 and the bonding device 5 (FIG. 1) is opened. Then, as shown in FIG. 3L, the lifting device 22 is elevated to lift up the laminate 7 to a height of the gate and then the laminate 7 is held and conveyed into the bonding device 5 by the internal conveying arm (not shown) (a laminate conveying process). In the bonding device 5, the adhesive attaching process of heating and pressurizing the laminate 7 is performed, so that the substrate 2 and the support 3 are bonded. In the meantime, a laminate 7' for which the adhesive attaching process has been performed is conveyed from the inside of the bonding device 5 and is then placed on the pins 22a of the lifting device 22 by the internal conveying arm. Then, the lifting device 22 is further elevated to lift up the laminate 7' to the height of the shutter 6 and the gate is closed to make the vacuum state in the attaching device 1 be the same as the vacuum state of a room in which the conveying device is provided. After that, the shutter 6 is opened and the laminate 7' is conveyed to an outside of the attaching device 1 by the conveying arm 8 of the conveying device.

While the conveying of the laminate 7 by the internal conveying arm and the like are performed, the holding unit 32 of the support holding mechanism 31 located at the standby position is aligned (a holding unit positioning process). That is, the upper positioning members 43 of the positioning mechanisms 41 are moved in the direction coming close to the holding unit 32 and are enabled to abut on the holding member 32c of the holding unit 32, thereby positioning the holding unit 32. Then, when the positioning of the holding unit 32 is over, the positioning members 43 are moved in the direction getting away from the holding unit 32 and are returned to the standby positions thereof.

By sequentially performing the above processes, the attaching process of the substrate 2 and the support 3 is performed. By repeating the attaching process, it is possible to continuously perform the attaching of the substrate 2 and the support 3.

According to the attaching method of this illustrative embodiment, in the support holding process (FIG. 2D), the support 3 is held so that at least the surface thereof, which is to be attached to the substrate 2 via the adhesive layer 4, is not contacted, and in the attaching process (FIG. 3J), the support 3 of which the surface is held not to be contacted is attached to the substrate 2. For this reason, it is possible to provide the attaching method having improved the positioning precision of the substrate 2 and the support 3 upon the attaching and the quality.

Second Illustrative Embodiment

Another illustrative embodiment of the present invention is described with reference to FIG. 4. Meanwhile, in below descriptions, the same configurations as those of the attaching device described in the first illustrative embodiment are denoted with the same reference numerals and the descriptions thereof are omitted.

Figure 4:
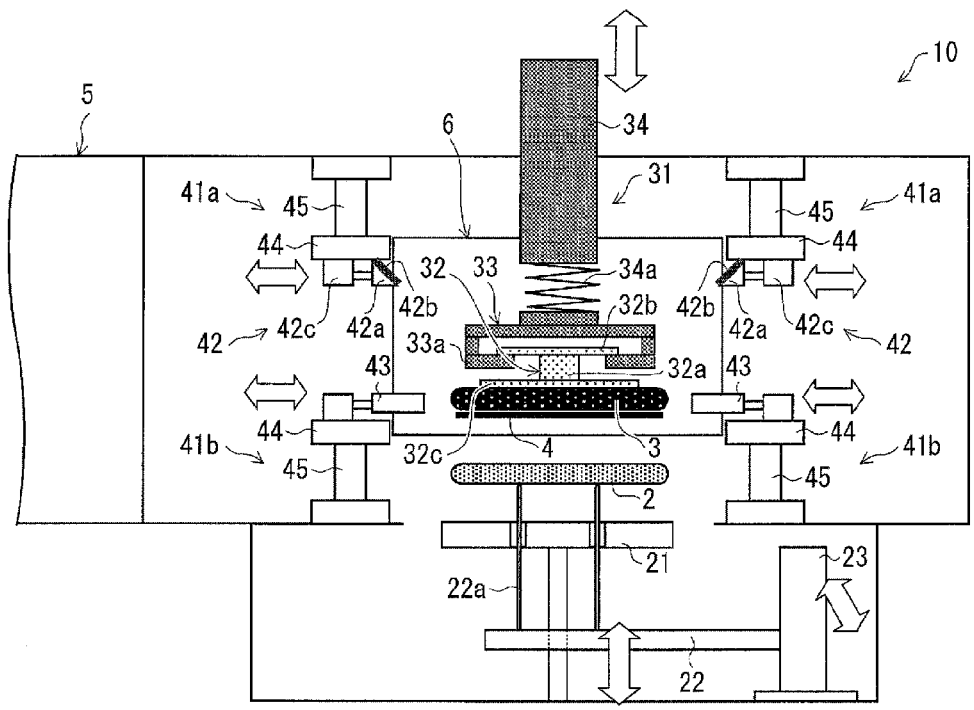
FIG. 4 is a front view illustrating a schematic configuration of an attaching device according to a second illustrative embodiment of the present invention.

As shown in FIG. 4, an attaching device 10 of this illustrative embodiment has positioning mechanisms 41a, 41b, instead of the positioning mechanism 41 (FIG. 1). The positioning mechanisms 41a, 41b are provided to face each other with a support holding mechanism 31 being interposed therebetween. Therefore, the attaching device 10 has a pair of the positioning mechanisms 41a, 41b, respectively.

The positioning mechanism 41a has a support holding member 42 and is mounted to a ceiling part of the attaching device 10. The positioning mechanism 41b has a positioning member 43 and is mounted to a bottom part of the attaching device 10. That is, the positioning mechanism of the attaching device 10 according to this illustrative embodiment is provided as two separated parts including the positioning mechanisms 41a having the support holding members 42 and the positioning mechanisms 41b having the positioning members 43. Also, the slide unit 44 and the motor 45 are provided for both the positioning mechanisms 41a and the positioning mechanisms 41b.

Also in the attaching device 10 having the above configuration, it is possible to accomplish the same effects as the first illustrative embodiment. Also, it is possible to perform the same attaching process as the attaching device by using the attaching device 10 having the above configuration. That is, it is possible to provide the attaching device and the attaching method having improved the positioning precision of the substrate and the support upon the attaching and the quality.

Third Illustrative Embodiment

Another illustrative embodiment of the present invention is described with reference to FIGS. 5 to 7. Meanwhile, in below descriptions, the same configurations as those of the attaching device described in the first illustrative embodiment are denoted with the same reference numerals and the descriptions thereof are omitted.

<Attaching Device>

Figure 5:
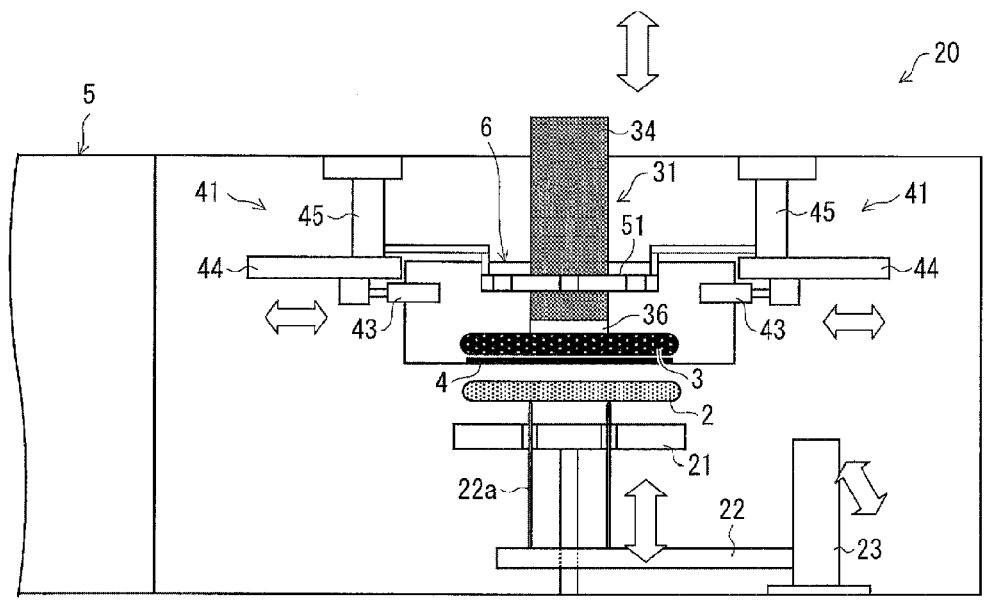
FIG. 5 is a front view illustrating a schematic configuration of an attaching device according to a third illustrative embodiment of the present invention.

As shown in FIG. 5, an attaching device 20 of this illustrative embodiment has a holding unit 36, instead of the holding unit 32 (FIG. 1) and the accommodation unit 33 (FIG. 1), and a Bernoulli chuck (support holding member) 51, instead of the support holding member 42 (FIG. 1).

The holding unit 36 is provided at the lower part of the lifting device 34 of the support holding mechanism 31 and is configured to hold (chuck) the support 3 by the vacuum adsorption or electrostatic adsorption. The holding unit 36 is configured to hold a surface of the support 3, which is different from the surface of the support to be attached to the substrate 2. A size of the holding unit 36 may be any size capable of stably holding the support 3. Also, the holding unit 36 is provided with a supply pipe (not shown) configured to supply nitrogen gas, for example, between the holding unit 36 and the support 3 so that the support 3 can be easily separated when releasing the holding of the support 3. An operation of the holding unit 36 is controlled by the control unit (not shown).

The Bernoulli chuck 51, which is the support holding member, is provided to bridge between the pair of positioning mechanisms 41, and a position thereof is fixed. The Bernoulli chuck 51 is formed at its central part with an opening through which the lifting device 34 passes, and thus has a ring-shaped outward appearance. The Bernoulli chuck 51 is configured to eject the inert gas such as nitrogen gas, thereby suspending and holding the support 3 in a non-contact manner with being floated in an air by the Bernoulli's principle. That is, the Bernoulli chuck 51 is configured to hold the support 3 without coming into contact with at least the surface of the support 3, which is to be attached to the substrate 2 via the adhesive layer 4.

<Attaching Method>

An attaching method of the substrate 2 and the support 3 using the attaching device 20 having the above configuration, i.e., the attaching process is sequentially described with reference to FIGS. 6 and 7. Meanwhile, in below descriptions, the descriptions of the same processes as the respective processes of the attaching process described in the first illustrative embodiment are simplified (or omitted).

Figure 6A:
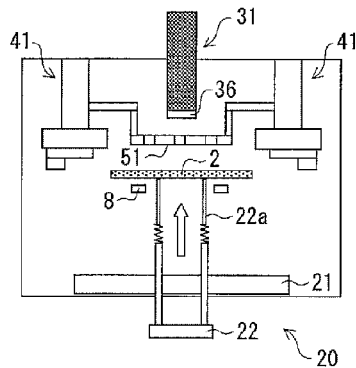
FIGS. 6A to 6F are schematic front views sequentially illustrating an attaching process by the attaching device according to the third illustrative embodiment of the present invention.

First, as shown in FIG. 6A, the substrate 2 is conveyed into the attaching device 20 by the conveying arm 8 of the conveying device, and the substrate 2 is placed on the plurality of pins 22a of the elevated lifting device 22 (a substrate carrying-in process). At this time, the support holding mechanism 31 is located at the upper standby position and the positioning mechanisms 41 are located at the standby positions spaced from the substrate 2. Also, while the heater provided on the lower surface of the stage 21 is operating, the vacuum pump is not operating.

Figure 6B:
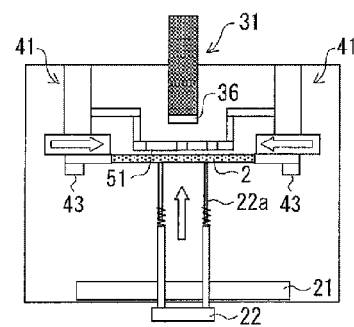

Then, as shown in FIG. 6B, the lifting device 22 is further elevated to lift up the substrate 2 to the heights of the upper positioning members 43 of the positioning mechanisms 41. Then, the positioning of the substrate 2 is performed (a substrate positioning process).

Figure 6C:
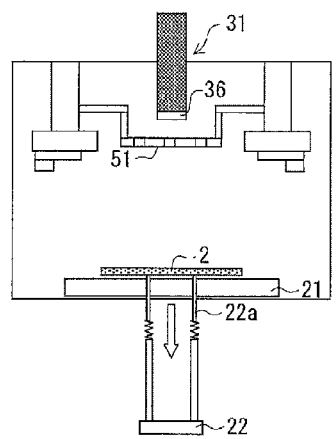

Then, as shown in FIG. 6C, when the positioning of the substrate 2 is over, the positioning members 43 are moved in the direction getting away from the substrate 2, the lifting device 22 is lowered to place the substrate 2 on the stage 21 and the substrate 2 is heated (preheated) (a substrate heating process).

Figure 6D:
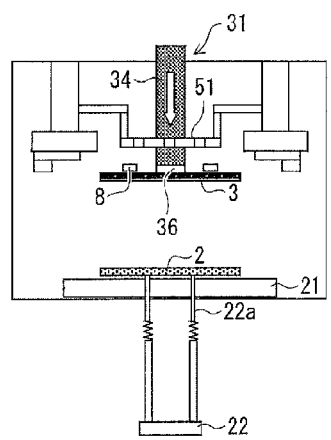

Subsequently, as shown in FIG. 6D, the support 3 is conveyed into the attaching device 20 by the conveying arm 8 of the conveying device and the support 3 is held by the holding unit 36 provided at the lower part of the lowered lifting device 34 (a support carrying-in process). That is, the holding unit 36 holds the support 3 without coming into contact with at least the surface of the support 3, which is to be attached to the substrate 2 via the adhesive layer 4.

Figure 6E:
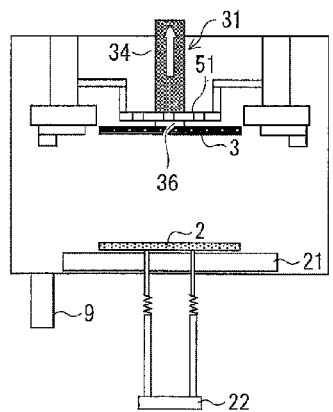

After that, as shown in FIG. 6E, the lifting device 34 is elevated to lift up the support 3 to a position at which the support 3 can be suspended and held by the Bernoulli chuck 51. At this time, the inert gas is ejected to set the Bernoulli chuck 51 to a state where it can suspend and hold the support 3.

Figure 6F:
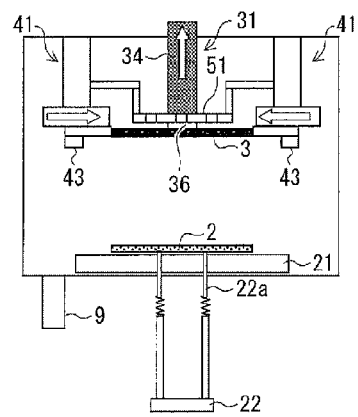
Figure 7G:
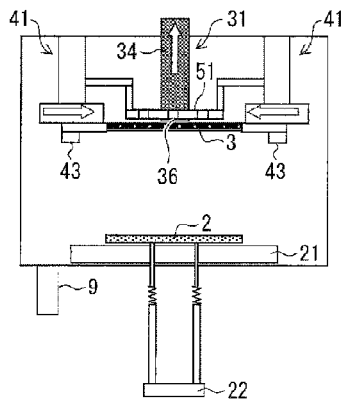
FIGS. 7G to 7K are schematic front views sequentially illustrating the attaching process by the attaching device according to the third illustrative embodiment of the present invention.

Then, as shown in FIG. 6F, the positioning members 43 are moved in the direction coming close to the support 3 and are enabled to abut on the support 3 held by the holding unit 36. Thereby, while preventing the support 3 from being dropped, the support 3 held by the holding unit 36 is transferred to the Bernoulli chuck 51. That is, as shown in FIG. 7G, the holding (chucking) of the support 3 by the holding unit 36 is released to elevate the lifting device 34 of the support holding mechanism 31, so that the holding of the support 3 is switched from the holding by the holding unit 36 to the suspension and holding by the Bernoulli chuck 51. Thereby, the support 3 is suspended and held by the Bernoulli chuck 51 (a support holding process). At this time, the Bernoulli chuck 51 holds the support 3 without coming into contact with at least the surface of the support 3, which is to be attached to the substrate 2 via the adhesive layer 4.

Subsequently, as shown in FIG. 7G, the positioning of the support 3 is performed by the positioning members 43. That is, the positioning members 43 are configured to perform the positioning of the support 3, which is suspended and held by the Bernoulli chuck 51 (a support positioning process).

Figure 7H:
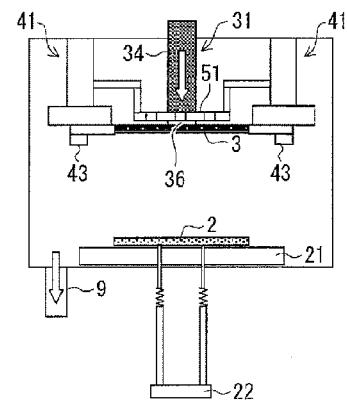

Subsequently, when the positioning of the support 3 is over, the lifting device 34 of the support holding mechanism 31 is lowered, as shown in FIG. 7H, so that the holding of the support 3 is switched from the suspension and holding by the Bernoulli chuck 51 to the holding (chucking) by the holding unit 36. At this time, the ejection of the inert gas to the Bernoulli chuck 51 is stopped. Also, after the inside of the attaching device is purged by the nitrogen gas, the vacuum pump is activated to vacuate the inside of the attaching device 20. Further, the positioning members 43 are moved in the direction getting away from the support 3 and are returned to the standby positions.

Figure 7I:
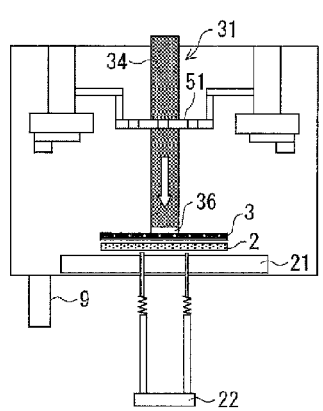

After that, as shown in FIG. 7I, the lifting device 34 of the support holding mechanism 31 is lowered to bring the support 3 close to the substrate 2. Thereby, the support 3 is heated (preheated) together with the substrate 2 (a support heating process). Then, the inside of the attaching device 20 is made to be a vacuum state appropriate to perform an attaching process (a higher vacuum state than the state where the alignment can be performed). Then, when the predetermined heating time period elapses, the lifting device 34 of the support holding mechanism 31 is further lowered to bring the support 3 into contact with the substrate 2. Thereby, the support 3 is attached to the substrate 2 via the adhesive layer (an attaching process). In the meantime, the operation of the vacuum pump is once stopped.

Figure 7J:
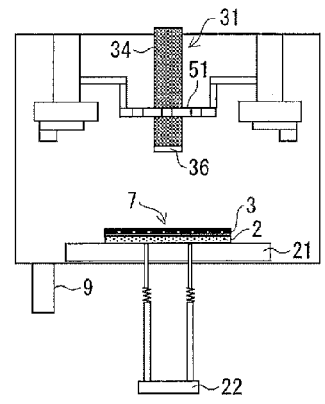

When the predetermined attaching time period elapses, the holding (chucking) of the support 3 by the holding unit 36 is released, and the lifting device 34 of the support holding mechanism 31 is elevated to the standby position, as shown in FIG. 7J. Thereby, a laminate 7 in which the substrate 2, the adhesive layer 4 and the support 5 are stacked in corresponding order is placed on the stage 21.

Figure 7K:
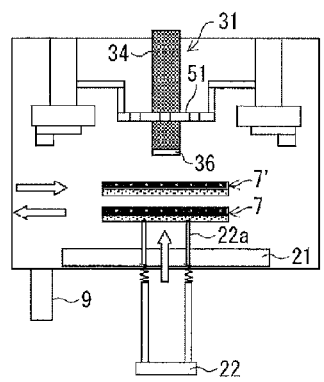

When the vacuum pump is again activated to make the inside of the attaching device 20 be the same as the vacuum state in the bonding device 5, as shown in FIG. 7K, the lifting device 22 is elevated to lift up the laminate 7 to the height of the gate and then the laminate 7 is held and conveyed into the bonding device 5 by the internal conveying arm (not shown) (a laminate conveying process). In the meantime, a laminate 7' for which the adhesive attaching process has been performed is conveyed from the inside of the bonding device 5 and is then placed on the pins 22a of the lifting device 22 by the internal conveying arm. Then, the lifting device 22 is further elevated to lift up the laminate 7' to the height of the shutter 6 and the gate is closed to make the vacuum state in the attaching device 20 be the same as the vacuum state of a room in which the conveying device is provided. After that, the shutter 6 is opened and the laminate 7' is conveyed to an outside of the attaching device 20 by the conveying arm 8 of the conveying device.

By sequentially performing the above processes, the attaching process of the substrate 2 and the support 3 is performed. By repeating the attaching process, it is possible to continuously perform the attaching of the substrate 2 and the support 3.

The attaching device 20 having the above configuration can also accomplish the same effects as the attaching device 1. Also, it is possible to perform the same attaching process as the attaching device 1 by using the attaching device 20 having the above configuration. That is, it is possible to provide the attaching device and the attaching method having improved the positioning precision of the substrate and the support upon the attaching and the quality.

Fourth Illustrative Embodiment

Another illustrative embodiment of the present invention is described with reference to FIGS. 8 to 10. Meanwhile, in below descriptions, the same configurations as those of the attaching device described in the first illustrative embodiment are denoted with the same reference numerals and the descriptions thereof are omitted.

<Attaching Device>

Figure 8:
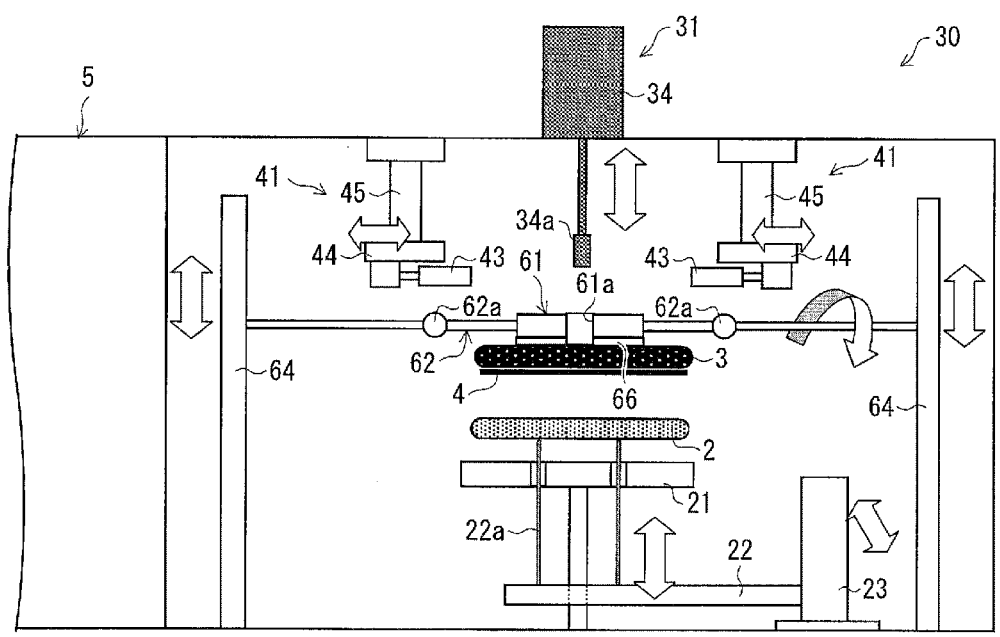
FIG. 8 is a front view illustrating a schematic configuration of an attaching device according to a fourth illustrative embodiment of the present invention.

As shown in FIG. 8, an attaching device 30 of this illustrative embodiment has a holding unit 66, instead of the holding unit 32 (FIG. 1) and the accommodation unit 33 (FIG. 1), and a support holding member 61, instead of the support holding member 42 (FIG. 1). Also, the lower part of the lifting device 34 of the support holding mechanism 31 is provided with an abutting part 34a.

The holding unit 66 is provided at a lower part of the support holding member 61 and is configured to hold (chuck) the support 3 by the vacuum adsorption or electrostatic adsorption. The holding unit 66 is configured to hold a surface of the support 3, which is different from the surface of the support to be attached to the substrate 2. That is, the holding unit 66 is configured to hold the support 3 without coming into contact with at least the surface of the support 3, which is to be attached to the substrate 2 via the adhesive layer 4. A size of the holding unit 66 may be any size capable of stably holding the support 3. Also, the holding unit 66 is provided with a supply pipe (not shown) configured to supply nitrogen gas, for example, between the holding unit 66 and the support 3 so that the support 3 can be easily separated when releasing the holding of the support 3. An operation of the holding unit 66 is controlled by the control unit (not shown).

The support holding member 61 is mounted to a central part of a reversal mechanism 62 bridging between a pair of lifting mechanisms 64. The support holding member 61 is provided at its lower part with the holding unit 66 and is formed at its central part with an opening 61a through which the abutting part 34a of the lifting device 34 passes and thus has a ring-shaped outward appearance. The opening 61a is also formed at the holding unit 66 in the same manner. Therefore, the holding unit 66 also has a ring-shaped outward appearance. Thereby, the abutting part 34a of the lifting device 34 protrudes more downwardly than the holding unit 66 through the opening 61a.

The lifting mechanisms 64 are configured to vertically move the support holding member 61 mounted to the reversal mechanism 62, together with the reversal mechanism 62.

The reversal mechanism 62 is provided to bridge between the pair of lifting mechanisms 64, and has reversal members 62a at both end portions thereof. That is, the reversal mechanism 62 is rotatably mounted to the lifting mechanisms 64 by the pair of reversal members 62a and can be thus rotated about a part serving as a shaft between the reversal members 62a. The reversal mechanism 62 has the support holding member 61 at a central part thereof.

The support holding member 61 is configured to operate integrally with the reversal mechanism 62. Therefore, the support holding member 61 serves both as a function of the support holding member and a function of the reversal mechanism. That is, the support holding member 61 is configured to rotate by the reversal mechanism 62, so that it serves as the reversal mechanism configured to reverse upper and lower surfaces of the support 3. In this way, the attaching device 30 is configured to reverse the support 3 at an inside (superimposition part) thereof.

The operations of the support holding member 61, the reversal mechanism 62 and the lifting devices 64 are controlled by the control unit (not shown).

<Attaching Method>

An attaching method of the substrate 2 and the support 3 using the attaching device 30 having the above configuration, i.e., the attaching process is sequentially described with reference to FIGS. 9 and 10. Meanwhile, in below descriptions, the descriptions of the same processes as the respective processes of the attaching process described in the first illustrative embodiment are simplified (or omitted).

Figure 9A:
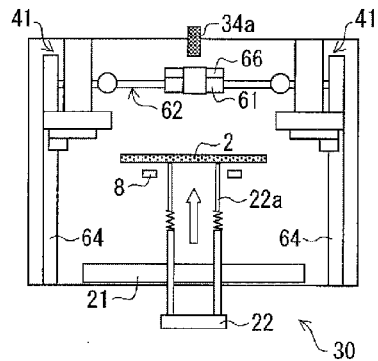
FIGS. 9A to 9F are schematic front views sequentially illustrating an attaching process by the attaching device according to the fourth illustrative embodiment of the present invention.

First, as shown in FIG. 9A, the substrate 2 is conveyed into the attaching device 30 by the conveying arm 8 of the conveying device, and the substrate 2 is placed on the plurality of pins 22a of the elevated lifting device 22 (a substrate carrying-in process). At this time, the support holding mechanism 61 is located at the upper standby position by a lifting operation of the lifting mechanisms 64 and the positioning mechanisms 41 are located at the standby positions spaced from the substrate 2. Also, the holding unit 66 provided for the support holding mechanism 61 is made to face towards an upper side (a side not facing the substrate 2) by a rotating operation of the reversal mechanism 62. Further, while the heater provided on the lower surface of the stage 21 is operating, the vacuum pump is not operating.

Figure 9B:
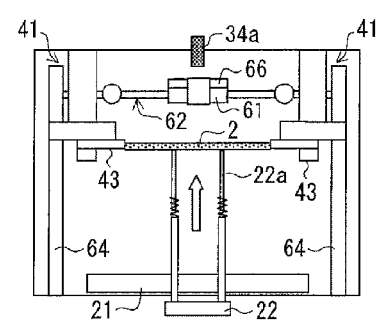

Then, as shown in FIG. 9B, the lifting device 22 is further elevated to lift up the substrate 2 to the heights of the upper positioning members 43 of the positioning mechanisms 41. Then, the positioning of the substrate 2 is performed (a substrate positioning process).

Figure 9C:
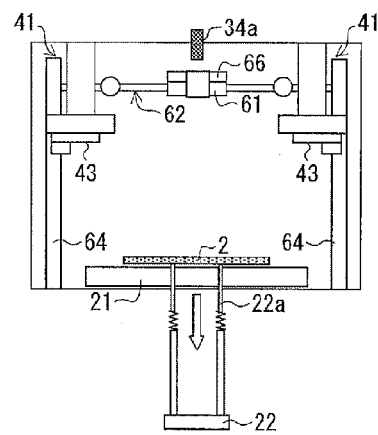

Then, as shown in FIG. 9C, when the positioning of the substrate 2 is over, the positioning members 43 are moved in the direction getting away from the substrate 2, the lifting device 22 is lowered to place the substrate 2 on the stage 21 and the substrate 2 is heated (preheated) (a substrate heating process).

Figure 9D:
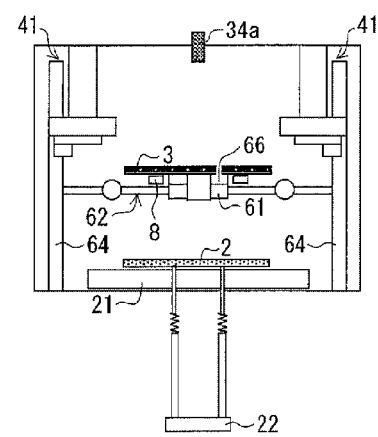

Subsequently, as shown in FIG. 9D, the support holding mechanism 61 is lowered to a position, at which the support 3 can be transferred, by the lifting operation of the lifting mechanisms 64 and then the support 3 is conveyed into the attaching device 30 by the conveying arm 8 of the conveying device. At this time, the support 3 is conveyed into the attaching device 30 with the surface, which is to be attached to the substrate 2 via the adhesive layer 4, being faced upwards. Therefore, the conveying arm 8 holds the surface of the support 3, which is different from the surface of the support to be attached to the substrate 2. Then, the support 3 is held by the holding unit 66 provided for the lowered support holding mechanism 61 (a support carrying-in process, a support holding process). That is, the holding unit 66 holds the support 3 without coming into contact with at least the surface of the support 3, which is to be attached to the substrate 2 via the adhesive layer 4.

Figure 9E:
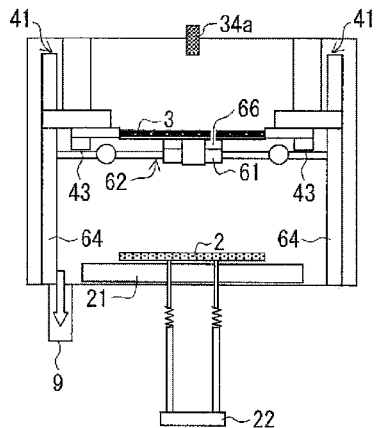

After that, as shown in FIG. 9E, the support 3 held at the holding unit 66 of the support holding mechanism 61 is lifted up to the heights of the upper positioning members 43 of the positioning mechanisms 41 by the lifting operation of the lifting mechanisms 64. Then, the positioning members 43 are moved in the direction coming close to the support 3 and are enabled to abut on the support 3 held by the holding unit 66. Thereby, the positioning of the support 3 is performed by the positioning members 43. That is, the positioning members 43 are configured to perform the positioning of the support 3 (a support positioning process). Also, after the inside of the attaching device is purged by the nitrogen gas, the vacuum pump is activated to vacuate the inside of the attaching device 30.

Figure 9F:
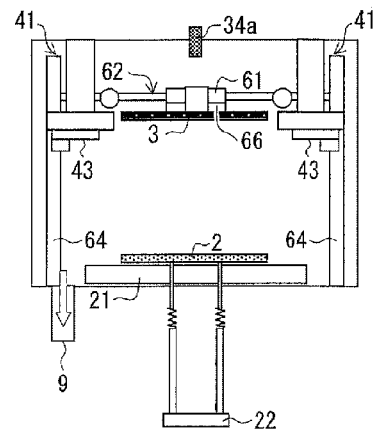

Then, when the positioning of the support 3 is over, the positioning members 43 are moved in the direction getting away from the support 3 and are returned to the standby positions, as shown in FIG. 9F. After the support holding mechanism 61 is further elevated by the lifting operation of the lifting mechanisms 64, the support holding mechanism 61 is reversed by a rotating operation of the reversal mechanism 62 (a reversing process). That is, the reversing process of reversing the upper and lower surfaces of the support 3 is performed to reverse the support 3 held at the holding unit 66, thereby enabling the support to face towards a lower side (a side facing the substrate 2). Thereby, the surface of the support 3 to be attached to the substrate 2 is enabled to face the substrate 2. In this way, the reversal mechanism 62 and the support holding member 61 are configured to reverse the support 3 after the positioning of the support 3 is performed. That is, the reversing process is performed after the support positioning process.

Figure 10G:
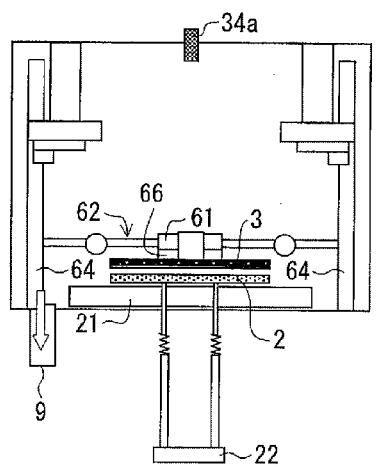
FIGS. 10G to 10J are schematic front views sequentially illustrating the attaching process by the attaching device according to the fourth illustrative embodiment of the present invention.

After that, as shown in FIG. 10G, the support holding mechanism 61 is lowered to bring the support 3 close to the substrate 2 by the lifting operation of the lifting mechanisms 64. Thereby, the support 3 is heated (preheated) together with the substrate 2 (a support heating process). Then, the inside of the attaching device 30 is made to be a vacuum state appropriate to perform an attaching process (a higher vacuum state than the state where the alignment can be performed). Then, when the predetermined heating time period elapses, the support holding mechanism 61 is further lowered to bring the support 3 into contact with the substrate 2 by the lifting operation of the lifting mechanisms 64.

Figure 10H:
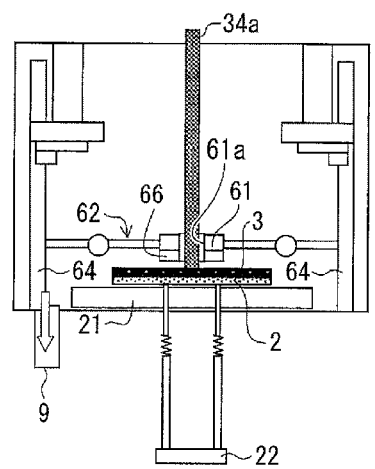

Subsequently, as shown in FIG. 10H, the abutting part 34a of the lifting device 34 is lowered, is enabled to pass through the opening 61a of the support holding mechanism 61 and to protrude more downwardly than the holding unit 66 and is thus contacted to the support 3. At this time, the holding (chucking) of the support 3 by the holding unit 66 is released. Thereby, the support 3 is pressed and is attached to the substrate 2 via the adhesive layer 4 (an attaching process).

Figure 10I:
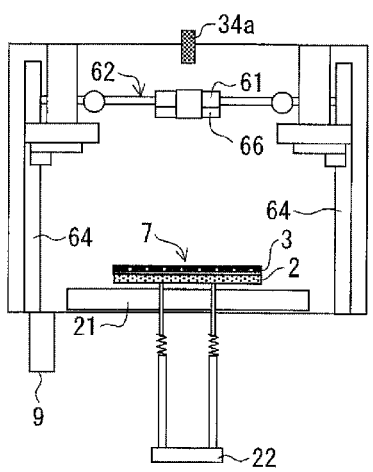

When the predetermined attaching time period elapses, the support holding mechanism 61 is elevated to the standby position and the abutting part 34a of the lifting device 34 is elevated to the standby position by the lifting operation of the lifting mechanisms 64, as shown in FIG. 10I. Thereby, a laminate 7 in which the substrate 2, the adhesive layer 4 and the support 3 are stacked in corresponding order is placed on the stage 21.

Figure 10J:
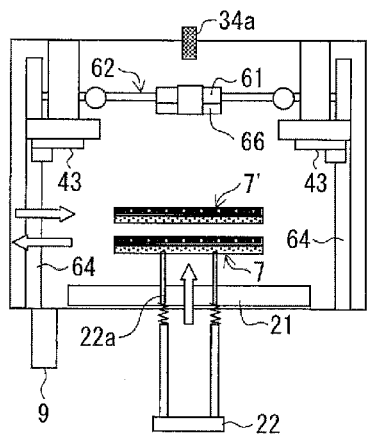

When the vacuum state in the attaching device 30 is the same as the vacuum state in the bonding device 5, the lifting device 22 is elevated to lift up the laminate 7 to the height of the gate and then the laminate 7 is held and conveyed into the bonding device 5 by the internal conveying arm (not shown) (a laminate conveying process), as shown in FIG. 10J. In the meantime, a laminate 7' for which the adhesive attaching process has been performed is conveyed from the inside of the bonding device 5 and is then placed on the pins 22a of the lifting device 22 by the internal conveying arm. Then, the lifting device 22 is further elevated to lift up the laminate 7' to the height of the shutter 6 and the gate is closed to make the vacuum state in the attaching device 30 be the same as the vacuum state of a room in which the conveying device is provided. After that, the shutter 6 is opened and the laminate 7' is conveyed to an outside of the attaching device 30 by the conveying arm 8 of the conveying device.

While the conveying of the laminate 7 by the internal conveying arm and the like are performed, the support holding mechanism 61 located at the standby position is reversed by the rotating operation of the reversal mechanism 62. That is, the holding unit 66 provided for the support holding mechanism 61 is enabled to face towards the upper side (side not facing the substrate 2) by the rotating operation of the reversal mechanism 62.

By sequentially performing the above processes, the attaching process of the substrate 2 and the support 3 is performed. By repeating the attaching process, it is possible to continuously perform the attaching of the substrate 2 and the support 3. Since the attaching device 30 having the above configuration is configured to reverse the support 3 at the inside thereof, it is not necessary to separately provide a reversal device at an outside of the attaching device 30.

The attaching device 30 having the above configuration can also accomplish the same effects as the attaching device 1. Also, it is possible to perform the same attaching process as the attaching device 1 by using the attaching device 30 having the above configuration. That is, it is possible to provide the attaching device and the attaching method having improved the positioning precision of the substrate and the support upon the attaching and the quality.

Fifth Illustrative Embodiment

Another illustrative embodiment of the present invention is described with reference to FIG. 11. Meanwhile, in below descriptions, the same configurations as those of the attaching device described in the fourth illustrative embodiment are denoted with the same reference numerals and the descriptions thereof are omitted.

Figure 11A:
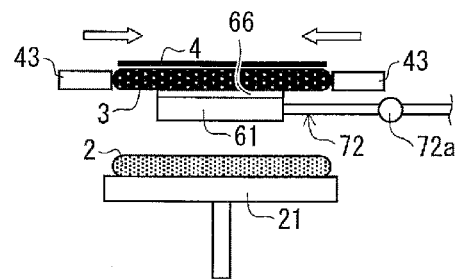
FIGS. 11A to 11D are schematic front views sequentially illustrating main parts of an attaching process by an attaching device according to a fifth illustrative embodiment of the present invention.

As shown in FIG. 11A, an attaching device of this illustrative embodiment has a reversal mechanism 72, instead of the reversal mechanism 62 (FIG. 8).

Figure 11B:
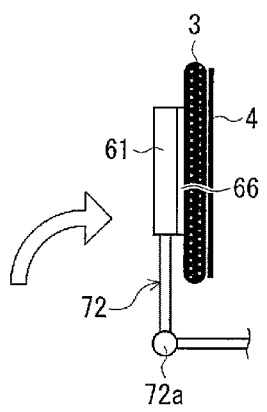
Figure 11C:
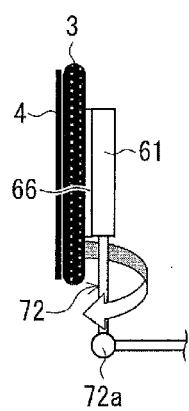

The reversal mechanism 72 protrudes from the lifting device 64 and is thus configured to vertically move by the lifting device 64. The reversal mechanism 72 has a reversal member 72a. That is, the reversal mechanism 72 is mounted to the lifting device 64 by the reversal member 72a. Thereby, the reversal mechanism 72 is configured to be pivotable about the reversal member 72a in an upper-lower direction, and is configured to be rotatable about the reversal member 72a serving as a shaft end at a vertical state where the reversal mechanism has been pivoted upwards, as shown in FIGS. 11B and 11C.

The reversal mechanism 72 has the support holding member 61 at a tip portion thereof. The support holding member 61 is configured to operate integrally with the reversal mechanism 72 and thus serves both a function of the support holding member and a function of the reversal mechanism. That is, the support holding member 61 is configured to pivot and rotate by the reversal mechanism 72, so that it serves as the reversal mechanism configured to reverse the upper and lower surfaces of the support 3. In the meantime, a pair of the lifting devices 64 is not necessarily provided and only one may be provided.

The operations of the support holding member 61, the reversal mechanism 72 and the lifting device 64 are controlled by the control unit (not shown).

<Attaching Method>

A reversing process of the support 3 using the attaching device having the above configuration is sequentially described with reference to FIG. 11. Meanwhile, in below descriptions, the descriptions of the same processes as the respective processes of the attaching process described in the fourth illustrative embodiment are simplified (or omitted).

First, the same processes as the processes shown in FIGS. 9A to 9D are performed to position the substrate 2 and the support 3.

Subsequently, as shown in FIG. 11A, when the positioning of the support 3 is over, the positioning members 43 are moved in the direction getting away from the support 3 and are returned to the standby positions. Then, the support holding member 61 is reversed by the pivoting and rotating operations of the reversal mechanism 72 (a reversing process). That is, as shown in FIG. 11B, the reversal mechanism 72 is pivoted upwards about the reversal member 72a, so that the support holding member 61 is set to a vertical state. Then, as shown in FIG. 11C, the reversal mechanism 72 is rotated by 180° about the reversal member 72a serving as a shaft end at the vertical state where the reversal member has been pivoted upwards, thereby reversing the direction of the support holding member 61. After that, the reversal mechanism 72 is pivoted downwards about the reversal member 72a, so that the support holding member 61 is set to a horizontal state.

Figure 11D:
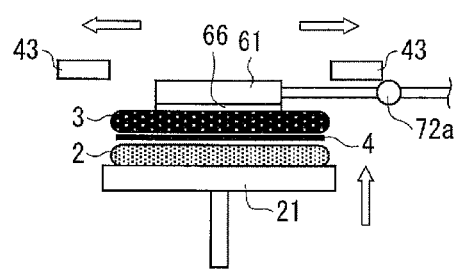

Thereby, as shown in FIG. 11D, the support 3 held at the holding unit 66 is reversed, so that it faces towards a lower side (a side facing the substrate 2). That is, the surface of the support 3 to be attached to the substrate 2 is enabled to face the substrate 2. In this way, the reversal mechanism 72 and the support holding member 61 are configured to reverse the support 3 after the positioning of the support 3 is performed. That is, the reversing process is performed after the support positioning process.

Thereafter, the same processes as the processes shown in FIGS. 10G to 10J are performed to attach the substrate 2 and the support 3.

The attaching device having the above configuration can also accomplish the same effects as the attaching device 30. Also, it is possible to perform the same attaching process as the attaching device 30 by using the attaching device having the above configuration. That is, it is possible to provide the attaching device and the attaching method having improved the positioning precision of the substrate and the support upon the attaching and the quality.

Sixth Illustrative Embodiment

Another illustrative embodiment of the present invention is described with reference to FIG. 12. Meanwhile, in below descriptions, the same configurations as those of the attaching device described in the first illustrative embodiment are denoted with the same reference numerals and the descriptions thereof are omitted.

Figure 12:
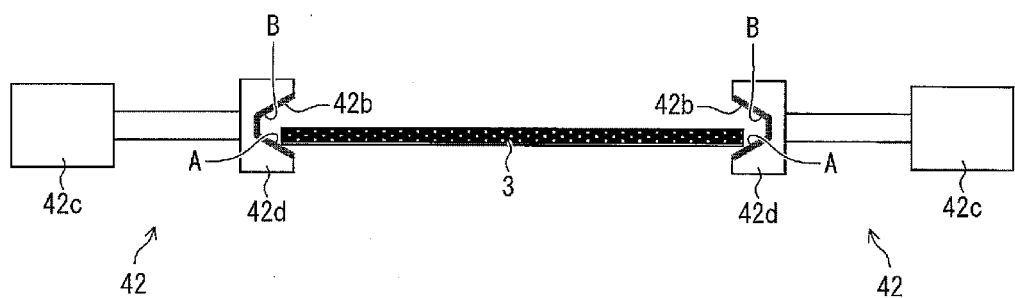
FIG. 12 is a schematic front view illustrating main parts of an attaching process by an attaching device according to a sixth illustrative embodiment of the present invention.

As shown in FIG. 12, a support holding member 42 of an attaching device according to this illustrative embodiment has a hoe-shaped holding tool 42d having an oblique surface part A and an inverted oblique surface part B arranged at a perpendicular upper part to the oblique surface part A, instead of the holding tool 42a having the oblique surface part (FIG. 1). A contact member 42b made of rubber or fluorine resin is bonded to the oblique surface part A and inverted oblique surface part B of the holding tool 42d so as to prevent the damage of the support 3.

The oblique surface part A of the holding tool 42d exhibits the equivalent effects to the oblique surface part of the holding tool 42a. That is, the holding tool 42d is configured to hold the support 3 with the oblique surface part A (the contact member 42b) without coming into contact with at least the surface of the support 3, which is to be attached to the substrate 2 via the adhesive layer 4. More preferably, the holding tool 42d is configured to hold an end portion of the support 3 with the oblique surface part A (the contact member 42b) upon the carrying-in of the support 3.

The inverted oblique surface part B of the holding tool 42d is to prevent the support 3 from dropping from the holding tool 42d. That is, the inverted oblique surface part B is provided at the perpendicular upper part to the oblique surface part A configured to hold the support 3 in the non-contact manner, so that the inverted oblique surface part B is covered to the support 3 with a gap therebetween. Thereby, even if the support 3 fluctuates vertically on the holding tool 42d upon the carrying-in of the support 3, for example, a range of the fluctuation is limited and the dropping of the support 3 can be thus prevented.

The attaching device having the above configuration can also accomplish the same effects as the attaching device 1. Also, it is possible to perform the same attaching process as the attaching device 1 by using the attaching device having the above configuration. That is, it is possible to provide the attaching device and the attaching method having improved the positioning precision of the substrate and the support upon the attaching and the quality.

Seventh Illustrative Embodiment

Another illustrative embodiment of the present invention is described with reference to FIG. 13. Meanwhile, in below descriptions, the same configurations as those of the attaching device described in the first illustrative embodiment are denoted with the same reference numerals and the descriptions thereof are omitted.

<Attaching Device>

Figure 13A:
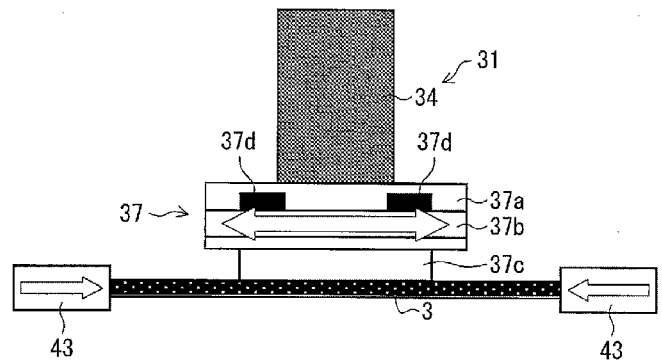
FIG. 13A is a schematic front view illustrating main parts of an attaching process by an attaching device according to a seventh illustrative embodiment of the present invention.

As shown in FIG. 13A, an attaching device of this illustrative embodiment has a holding unit 37, instead of the holding unit 32 (FIG. 1) and the accommodation unit 33 (FIG.

The holding unit 37 has a fixed part 37a, a parallel shift mechanism 37b, a holding member 37c and a lock mechanism 37d. The fixed part 37a is fixed to the lower part of the lifting device 34 of the support holding mechanism 31. The parallel shift mechanism 37b is arranged between the fixed part 37a and the holding member 37c and is configured to horizontally move the holding member 37c relative to the fixed part 37a. Meanwhile, the horizontal movement described here includes rotation, too. The parallel shift mechanism 37b may be mechanically implemented by a slide rail and the like or may be implemented using an electromagnet, for example.

The holding member 37c is configured to hold (chuck) the support 3 by the vacuum adsorption or electrostatic adsorption. The holding member 37c is configured to hold the surface of the support 3, which is different from the surface of the support to be attached to the substrate 2. A size of the holding member 37c may be any size capable of stably holding the support 3. Also, the holding member 37c is provided with a supply pipe (not shown) configured to supply nitrogen gas, for example, between the holding member 37c and the support 3 so that the support 3 can be easily separated when releasing the holding of the support 3. An operation of the holding member 37c is controlled by the control unit (not shown).

The lock mechanism 37d is provided for the fixed part 37a and is configured to switch a locked state and a non-locked state. When the lock mechanism 37d is at the locked state, the lock mechanism 37d fixes the holding member 37c relative to the fixed part 37a. When the lock mechanism 37d is at the non-locked state, the holding member 37c can be moved horizontally relative to the fixed part 37a by the parallel shift mechanism 37b. The lock mechanism 37d may be mechanically implemented or may be implemented using an electromagnet, for example.

<Attaching Method>

An attaching method of the substrate 2 and the support 3 using the attaching device having the above configuration, i.e., the attaching process is sequentially described with reference to FIGS. 13B to 13D. Meanwhile, in below descriptions, the descriptions of the same processes as the respective processes of the attaching process described in the first illustrative embodiment are simplified (or omitted).

Firsts, the same processes as the processes shown in FIGS. 2A to 2F are performed to perform the carrying-in of the substrate 2, the positioning of the substrate 2, the heating of the substrate 2, the carrying-in of the support 3 and the holding of the support 3 by the holding member 37c.

Figure 13B:
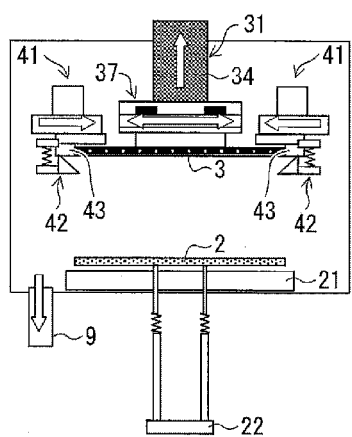
FIGS. 13B to 13D are schematic front views sequentially illustrating the attaching process by the attaching device according to the seventh illustrative embodiment of the present invention.

Subsequently, as shown in FIG. 13B, the lifting device 34 of the support holding mechanism 31 is elevated to lift up the support 3 to the heights of the lower positioning members 43 of the positioning mechanisms 41. Then, the positioning members 43 are moved in the direction coming close to the support 3, and are enabled to abut on the support 3 to position the support 3. That is, the positioning member 43 is configured to perform the positioning of the support 3 of which the surface is held not to be contacted (a support positioning process). At this time, the lock mechanism 37d of the support holding mechanism 31 is set to the non-locked state and the holding member 37c is horizontally moved relative to the fixed part 37a fixed to the lifting device 34 by the parallel shift mechanism 37b. Therefore, the support 3 can be positioned with being held at the holding member 37c. In the meantime, the holding tool 42a of the support holding member 42 is located at the lowered position and serves a dropping prevention function when the support 3 is separated from the holding member 37c of the holding unit 37. Also, since the positioning of the substrate 2 and support 3 is performed by the same positioning members 43, it is possible to further improve the alignment precision of the substrate and the support.

Figure 13C:
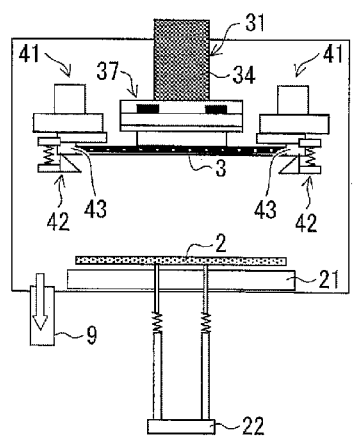

Then, when the positioning of the support 3 is over, the lock mechanism 37d is set to the locked state and the holding member 37c is fixed relative to the fixed part 37a with the support 3 being positioned, as shown in FIG. 13C. Thereby, it is possible to fix the position of the support 3 relative to the lifting device 34 with the support 3 being positioned (a support fixing process).

Figure 13D:
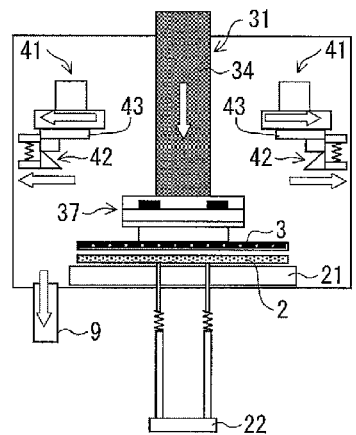

Then, as shown in FIG. 13D, after the support holding members 42 and the positioning members 43 are moved in the direction getting away from the support 3 and are returned to the standby positions, the lifting device 34 of the support holding mechanism 31 is lowered to bring the support 3 close to the substrate 2. Thereby, the support 3 is heated (preheated) together with the substrate 2 (a support heating process). In the meantime, the distance between the support 3 and the substrate 2 may be any distance within which the support and the substrate are not contacted to each other, for example, about 1 mm to 2 mm, preferably about 1 mm. Also, the heating time period is preferably about 10 seconds to 60 seconds.

At this time, the lifting device 34 is configured to bring the support 3 close to the substrate 2 at a state where the position of the support 3 relative to the lifting device 34 is fixed by the lock mechanism 37d. Thereby, during the approaching, it is possible to prevent the support 3 from deviating from the positioned location, thereby further improving the alignment precision of the substrate 2 and the support 3.

Thereafter, the same processes as the processes shown in FIGS. 3I to 3L are performed to attach the substrate 2 and the support 3.

The attaching device having the above configuration can also accomplish the same effects as the attaching device 1. Also, it is possible to perform the same attaching process as the attaching device 1 by using the attaching device having the above configuration. That is, it is possible to provide the attaching device and the attaching method having improved the positioning precision of the substrate and the support upon the attaching and the quality.

Other Illustrative Embodiments

In the attaching methods of the first to seventh illustrative embodiments, after the substrate 2 is conveyed into each attaching device and is positioned, the support 3 is conveyed and positioned. However, a method in which after the support 3 is conveyed into each attaching device and is positioned, the substrate 2 is conveyed and positioned may also be adopted.

Specifically, for example, in the attaching method of the first illustrative embodiment, after the support carrying-in process shown in FIG. 2D is performed and the respective processes shown in FIGS. 2E to 3G are performed, the substrate carrying-in process shown in FIG. 2A may be performed, the respective processes shown in FIGS. 2B and 2C may be performed and then the respective processes shown in FIGS. 3H to 3L may be performed.

Further, in the attaching method of the first illustrative embodiment, when the support carrying-in process is performed before the substrate carrying-in process, the function of the support holding member 42 of the attaching device 1 may be replaced with the plurality of pins 22a of the lifting device 22. That is, the plurality of pins 22a of the lifting device 22 may be provided with the function of the support holding member and the support holding member 42 may be omitted.

Also, for example, in the attaching method of the fourth illustrative embodiment, after the support carrying-in process shown in FIG. 9D is performed and the respective processes shown in FIGS. 9E and 9F are performed, the substrate carrying-in process shown in FIG. 9A may be performed, the respective processes shown in FIGS. 9B and 9C may be performed and then the respective processes shown in FIGS. 10G to 10J may be performed.

The present invention is not limited to the configurations described in the above illustrative embodiments and the specific configurations can be variously implemented. Further, the present invention is not limited to the above illustrative embodiments and can be variously changed within the scope defined in the claims, and an illustrative embodiment obtained by appropriately combining the defined technical means is also included in the technical scope of the present invention. Also, the documents disclosed in the specification are all incorporated by references.

INDUSTRIAL APPLICABILITY

The attaching device and the attaching method of the present invention can be widely used, for example, in a manufacturing process of a micro-fabricated semiconductor device.

DESCRIPTION OF REFERENCE NUMERALS

1: attaching device
2: substrate
3: support
4: adhesive layer
10: attaching device
20: attaching device
21: stage
22: lifting device
30: attaching device
31: support holding mechanism
32: holding unit
32c: holding member
34: lifting device
36: holding unit
37: holding unit
37b: parallel shift mechanism
37c: holding member
37d: lock mechanism
41: positioning mechanism
41a: positioning mechanism
41b: positioning mechanism
42: support holding member
42a: holding tool
42d: holding tool
43: positioning member
51: Bernoulli chuck (support holding member)
61: support holding mechanism
62: reversal mechanism
66: holding unit
72: reversal mechanism

What is claimed is:

1. An attaching device configured to attach a substrate and a support configured to support the substrate via an adhesive layer, the attaching device comprising:

a stage configured to have the substrate placed thereon;
a support holder configured to hold the support without coming into contact with a surface of the support that is to be attached to the substrate via the adhesive layer;
a horizontal adjuster configured to horizontally align the surface of the support to be attached to the substrate with the substrate;
a lift configured to vertically move the support holder so as to bring the support toward or away from the substrate; and
a reversal mechanism configured to reverse upper and lower surfaces of the support.

2. The attaching device according to claim 1, wherein the support holder is configured to hold an end portion of the support upon carrying-in of the support.

3. The attaching device according to claim 1, wherein the reversal mechanism is configured to reverse the support after positioning of the support is performed.

4. The attaching device according to claim 1, wherein the support holder doubles as the reversal mechanism.

5. The attaching device according to claim 2, wherein the support holder has a holding tool having an oblique surface part, the holding tool being configured to hold the support with the oblique surface part without coming into contact with at least the surface of the support.

6. The attaching device according to claim 2, wherein the support holder has a hoe-shaped holding tool having an oblique surface part and an inverted oblique surface part arranged at a perpendicular upper part to the oblique surface part.

7. A method of attaching a substrate and a support configured to support the substrate via an adhesive layer, the method comprising:

placing the substrate on a stage;
holding the support without coming into contact with a surface of the support that is to be attached to the substrate via the adhesive layer using a support holder;
horizontally aligning the surface of the support to be attached to the substrate with the substrate using a horizontal adjuster;
vertically moving the support holder so as to bring the support toward or away from the substrate using a lift; and
reversing upper and lower surfaces of the support using a reversal mechanism.

8. The method according to claim 7, further comprising positioning the support.

9. The method according to claim 7, further comprising holding an end portion of the support upon carrying-in of the support, before holding the support.

10. The method according to claim 7, further comprising positioning the support, wherein the reversing is performed after the support positioning.

11. The method according to claim 7, further comprising positioning the substrate.

12. The method according to claim 11, further comprising holding an end portion of the support upon carrying-in of the support, before holding the support, wherein the substrate positioning is performed before the support carrying-in.

* * * * *